(12) United States Patent
Barrett et al.

(10) Patent No.: US 7,911,310 B2
(45) Date of Patent: Mar. 22, 2011

(54) FULLY DIFFERENTIAL, HIGH Q, ON-CHIP, IMPEDANCE MATCHING SECTION

(75) Inventors: Carol Barrett, Mountain View, CA (US); Tom McKay, Felton, CA (US); Subhas Bothra, Fremont, CA (US)

(73) Assignee: Broadcom Corporation, Irvine, CA (US)

( * ) Notice: Subject to any disclaimer, the term of this patent is extended or adjusted under 35 U.S.C. 154(b) by 129 days.

(21) Appl. No.: 12/360,068

(22) Filed: Jan. 26, 2009

(65) Prior Publication Data

US 2009/0127654 A1   May 21, 2009

Related U.S. Application Data

(63) Continuation of application No. 11/504,073, filed on Aug. 15, 2006, now Pat. No. 7,489,221, which is a continuation of application No. 10/623,084, filed on Jul. 17, 2003, now Pat. No. 7,095,307.

(51) Int. Cl.
*H01F 5/00* (2006.01)
(52) U.S. Cl. ...................................................... 336/200
(58) Field of Classification Search .................. 336/65, 336/83, 200, 232; 257/531
See application file for complete search history.

(56) References Cited

U.S. PATENT DOCUMENTS

| | | | |
|---|---|---|---|
| 4,816,784 A * | 3/1989 | Rabjohn | 333/24 R |
| 6,476,704 B2 * | 11/2002 | Goff | 336/200 |
| 6,608,364 B2 | 8/2003 | Carpentier | |
| 6,717,502 B2 | 4/2004 | Yue | |
| 6,759,937 B2 | 7/2004 | Kyriazidou | |
| 6,798,327 B2 | 9/2004 | Yu et al. | |
| 6,809,623 B2 | 10/2004 | Kyriazidou et al. | |
| 6,867,677 B2 * | 3/2005 | Nielson | 336/200 |
| 6,937,128 B2 | 8/2005 | Contopanagos et al. | |
| 6,944,435 B2 | 9/2005 | Contopanagos et al. | |
| 6,979,608 B2 | 12/2005 | Contopanagos et al. | |
| 7,032,292 B2 | 4/2006 | Kyriazidou et al. | |
| 7,091,814 B2 | 8/2006 | Kyriazidou | |
| 7,095,307 B1 | 8/2006 | Barrett et al. | |
| 7,164,339 B2 * | 1/2007 | Huang | 336/200 |
| 7,236,080 B2 | 6/2007 | Kyriazidou et al. | |
| 7,489,221 B2 | 2/2009 | Barrett et al. | |
| 7,525,407 B2 * | 4/2009 | Lee et al. | 336/200 |

* cited by examiner

*Primary Examiner* — Tuyen Nguyen
(74) *Attorney, Agent, or Firm* — Sterne, Kessler, Goldstein & Fox P.L.L.C.

(57) ABSTRACT

An inductor circuit is disclosed. The inductor circuit includes a first in-silicon inductor and a second in-silicon inductor each having multiple turns. A portion of the multiple turns of the second in-silicon inductor is formed between turns of the first in-silicon inductor. The first and second in-silicon inductors are configured such that a differential current flowing through the first in-silicon inductor and the second in-silicon inductor flows in a same direction in corresponding turns of inductors.

39 Claims, 8 Drawing Sheets

FULLY DIFFERENTIAL, HIGH Q, ON-CHIP, IMPEDANCE MATCHING SECTION

CROSS-REFERENCE TO RELATED APPLICATIONS

This application is a Continuation of U.S. application Ser. No. 11/504,073, filed on Aug. 15, 2006, which is a Continuation of U.S. application Ser. No. 10/623,084, filed on Jul. 17, 2003, now U.S. Pat. No. 7,095,307, each of which is incorporated by reference in its entirety.

BACKGROUND OF THE INVENTION

1. Field of the Invention

This invention relates generally to impedance matching and impedance transformation, and more particularly to differential impedance matching and transformation.

2. Background Art

Impedance matching circuits generally are utilized to efficiently transfer energy at a junction point where electronic circuits having different characteristic impedances are connected to each other. This is accomplished by rendering the impedances seen on either side of the junction point identical, that is, to match line impedances and load impedances of the circuits.

Such line impedance matching is necessary not only for a wire terminal but also for a wireless terminal, wherein the impedances are matched at 50, 75 and 100 Ohms according to convention and the characteristics of the antenna and transmission lines. For example, radio frequency (RF) circuits often utilize a low noise amplifier (LNA) to amplify a received signal without adding significant noise. The performance of the LNA depends on the impedance of the circuit coupled to the LNA input. Generally, an LNA is designed to perform optimally while also providing a good impedance match. However, when the impedance is not matched, the performance, such as output power, efficiency, linearity, etc., of the LNA is degraded, as illustrated in FIG. 1.

FIG. 1 shows a prior art RF receiver chain 100 wherein signal reduction is experienced through mismatched impedances. The prior art RF receiver chain 100 includes an antenna 102, which provides a signal to an LNA via an LNA interface 106. The LNA is the first component in the receiver chain 100 to process incoming signals, after the antenna 102 and an RF filter. In order to keep the system sensitivity high, the LNA should receive as much of the signal as possible, which requires the LNA impedance to be matched to the antenna 102 impedance.

For example, in FIG. 1, the antenna 102 impedance is 50 Ohms. If the LNA impedance does not match the antenna 102 impedance of 50 Ohms, part of the signal 110 will "bounce" off and radiate back out of the antenna 102. As a result, the signal transfer 108 will be reduced and emissions problems may occur if the reflection is too large.

Hence, components are often added between the LNA and the antenna 102 to ensure that the impedances of the LNA and the antenna 102 match, as illustrated in FIG. 2. FIG. 2 is a block diagram showing an RF receiver circuit 200 utilizing discreet components. In particular, the RF receiver circuit 200 includes an antenna 102 coupled to an RF filter circuit 202. The RF filter circuit 202 includes a balun to provide a differential input to a discreet match circuit 204, which provides a differential input to the LNA 206 residing on a chip 208.

The discreet match circuit 204 utilizes discreet components, such as inductors, to match the impedance of the antenna 102 to the LNA 206. Unfortunately, discreet match components add extra cost and occupy valuable board space. For a differential LNA as illustrated in FIG. 2, two inductors are needed, which further increases the costs and the space required for the inductors.

In an attempt to reduce costs and save valuable board space, match inductors have been placed on the chip 208, as shown in FIG. 3. FIG. 3 is a block diagram showing an RF receiver circuit 300 utilizing in-silicon matching via inductors. Similar to FIG. 2, the RF receiver circuit 300 includes an antenna 102 connected to an RF filter circuit 202. However, the RF circuit 300 replaces the discreet match circuit of FIG. 2 with in-silicon inductors 302, which are incorporated on the chip 208 at the input of the LNA 206.

Although the two in-silicon inductors 302 do not occupy board space, unfortunately, the two in-silicon inductors 302 occupy a significant amount of silicon to achieve the required inductance. Also, a loss is associated with each in-silicon inductor 302, which is proportional to the metal length.

In view of the forgoing, there is a need for techniques for improved impedance matching and transformation. The impedance matching and transformation techniques should require less area and result in lower loss, thereby improving the noise figure.

BRIEF SUMMARY OF THE INVENTION

Broadly speaking, the present invention fills these needs by providing a fully differential, high-Q, on-chip impedance matching section using an interleaved differential inductor. In one embodiment, an impedance matching and transforming inductor circuit is disclosed. The impedance matching and transforming inductor circuit includes a first in-silicon inductor and a second in-silicon inductor each having multiple turns. A portion of the turns of the second in-silicon inductor is formed between turns of the first in-silicon inductor. The first and second in-silicon inductors are configured such that a differential current flowing through the first in-silicon inductor and the second in-silicon inductor flows in the same direction in corresponding turns of inductors.

For example, in one aspect, a portion of the first in-silicon inductor and a portion of the second in-silicon inductor can be formed on a first metal layer, such as a top metal layer such as the M6 metal layer. Similarly, a second portion of the first in-silicon inductor and the second in-silicon inductor can be formed on a second metal layer. To decrease resistance, the second portion of the first in-silicon inductor and the second in-silicon inductor can be formed on a second metal layer and a third metal layer. The second metal layer can be below the first metal layer and the third metal layer can be below the second metal layer, such as the M5 and M4 metal layers.

A method for making an interleaved inductor is disclosed in an additional embodiment of the present invention. The interleaved inductor can be an impedance matching and/or impedance transforming inductor. The method includes forming a first in-silicon inductor having multiple turns and creating a second in-silicon inductor also having multiple turns. As above, a portion of the turns of the second in-silicon inductor is formed between turns of the first in-silicon inductor. In addition, the inductors are configured such that a differential current flowing through the first in-silicon inductor and the second in-silicon inductor flows in the same direction in corresponding turns of the inductors.

Similar to above, the method can include forming a first portion of the first in-silicon inductor and a first portion of the second in-silicon inductor on a first metal layer, such as the top metal layer or M6 metal layer. Also as above, the method can include forming a second portion of the first in-silicon inductor and a second portion of the second in-silicon inductor on a second metal layer and a third metal layer, such as the M5 and M4 metal layers.

In a further embodiment of the present invention, an interleaved inductor is disclosed. The interleaved inductor includes a first in-silicon inductor having multiple turns. A portion of the first in-silicon inductor is formed on a first metal layer, and multiple connecting sections are formed on a second metal layer. In addition, a second in-silicon inductor having multiple turns is included. As with the first inductor, a portion of the second in-silicon inductor is formed on the first metal layer. Further, a portion of the turns of the second in-silicon inductor is formed between turns of the first in-silicon inductor. In this manner, a differential current flowing through the first in-silicon inductor and the second in-silicon inductor flows in the same direction in corresponding turns of the first in-silicon inductor and the second in-silicon inductor. In one aspect, the interleaved impedance matching inductor can be configured such that each connecting section of the first in-silicon inductor over-laps a portion of the second in-silicon inductor. Correspondingly, each connecting section of the second in-silicon inductor can overlap a portion of the first in-silicon inductor.

Embodiments of the present invention take advantage of the electromagnetic properties of differential inductors to reduce the size of the match circuit footprint. That is, because the inductance is higher in the interleaved differential inductor of the embodiments of the present invention, the interleaved differential inductor can have a high Q while being made smaller than conventional impedance matching inductor pairs. Thus, less metal is needed in each differential path through the interleave) differential inductor. Since loss is increased by the amount of metal traversed in a signal path. The interleaved differential inductor reduces signal loss. Other aspects and advantages of the invention will become apparent from the following detailed description, taken in conjunction with the accompanying drawings, illustrating by way of example the principles of the invention.

BRIEF DESCRIPTION OF THE DRAWINGS/FIGURES

The invention, together with further advantages thereof, may best be understood by reference to the following description taken in conjunction with the accompanying drawings in which.

DETAILED DESCRIPTION OF THE INVENTION

An invention is disclosed for a fully differential, high-Q, on-chip impedance matching section. Generally speaking, embodiments of the present invention provide impedance matching using an interleaved differential inductor. The interleaved differential inductor is comprised of two inductors, wherein one of the inductors is flipped about the center axis and interleaved with the other inductor. In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

As discussed above, radio frequency integrated circuits (RF ICs) generally are designed to include inductors for impedance matching. The inductance and quality factor (Q) of the inductor are decisive factors for determining the performance of the matching circuit. It is possible to realize an integrated inductor, which is formed by integrating an inductor on a substrate. In which case, the performance of the integrated inductor can be dependent on a substrate onto which the inductor is integrated and the capacitive coupling that is caused by the parasitic capacitance between the metal line for the inductor and the substrate. As the parasitic capacitance is increased, Q is reduced, which causes deterioration of the RF IC performance. Additionally, Q will be reduced due to a magnetically induced image current flowing on a lower portion of the substrate and other resistive losses.

Figure 1:
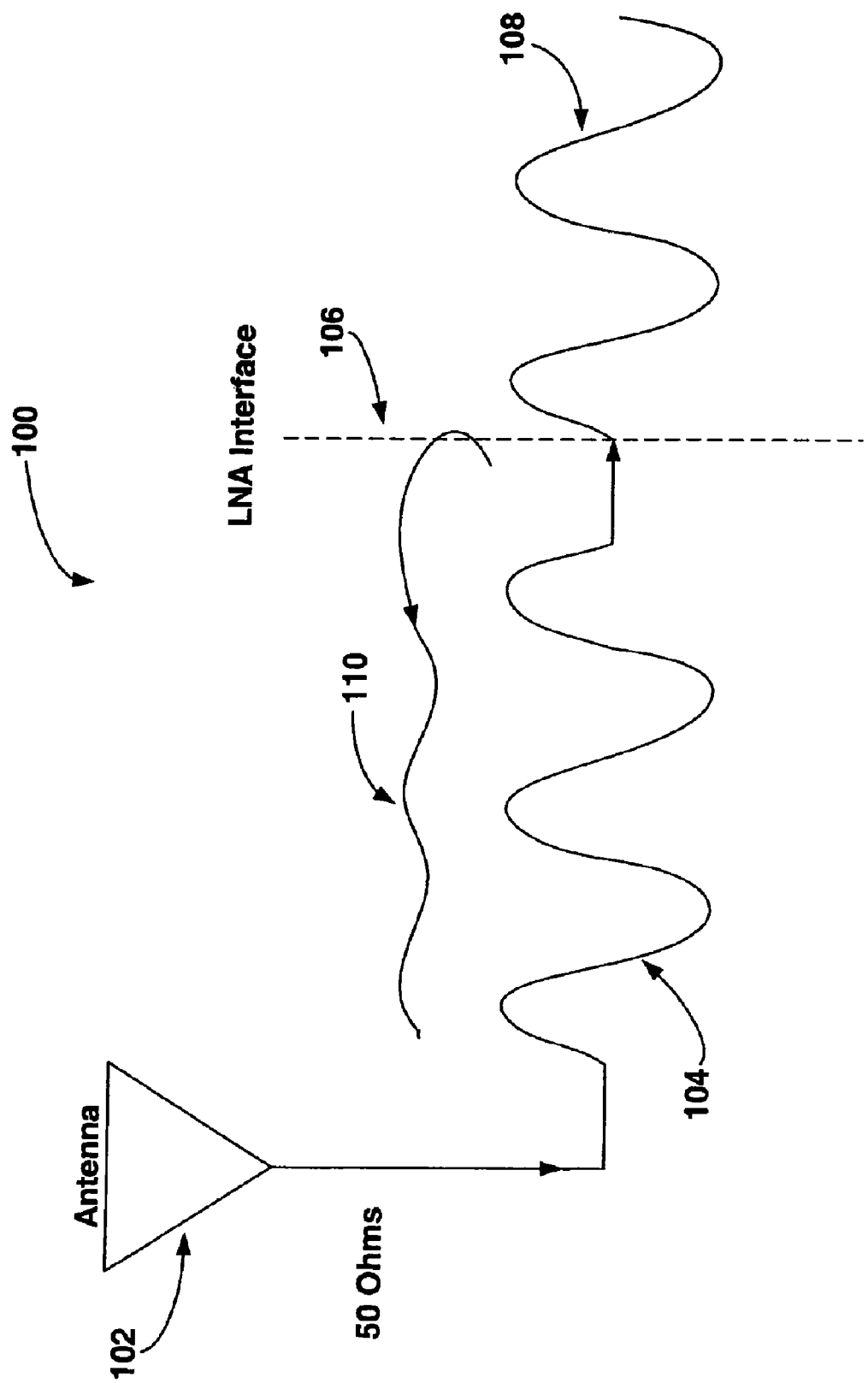
FIG. 1 shows a prior art RF receiver chain wherein signal reduction is experienced through mismatched impedances.
Figure 2:
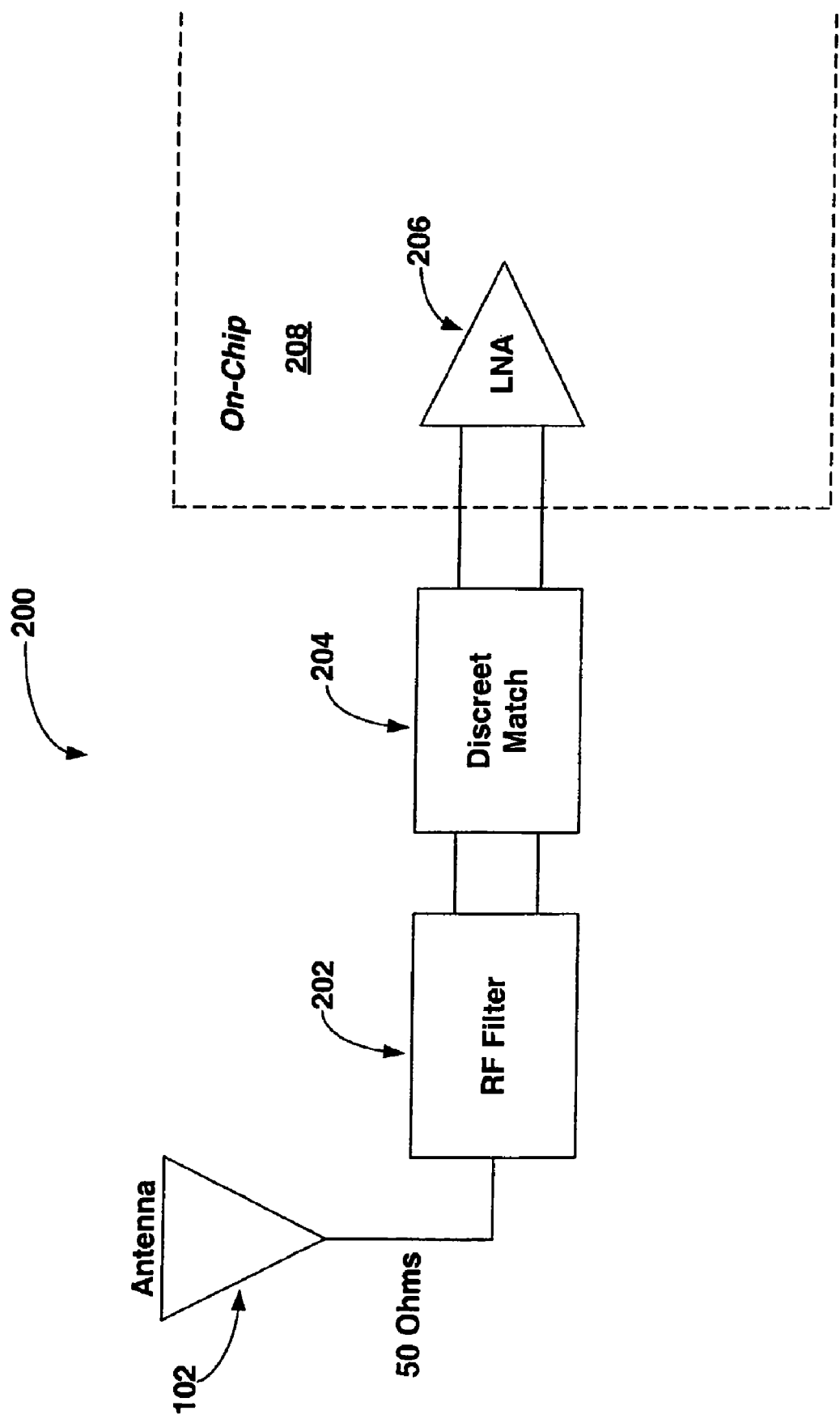
FIG. 2 is a block diagram showing an RF receiver circuit utilizing discreet components.
Figure 3:
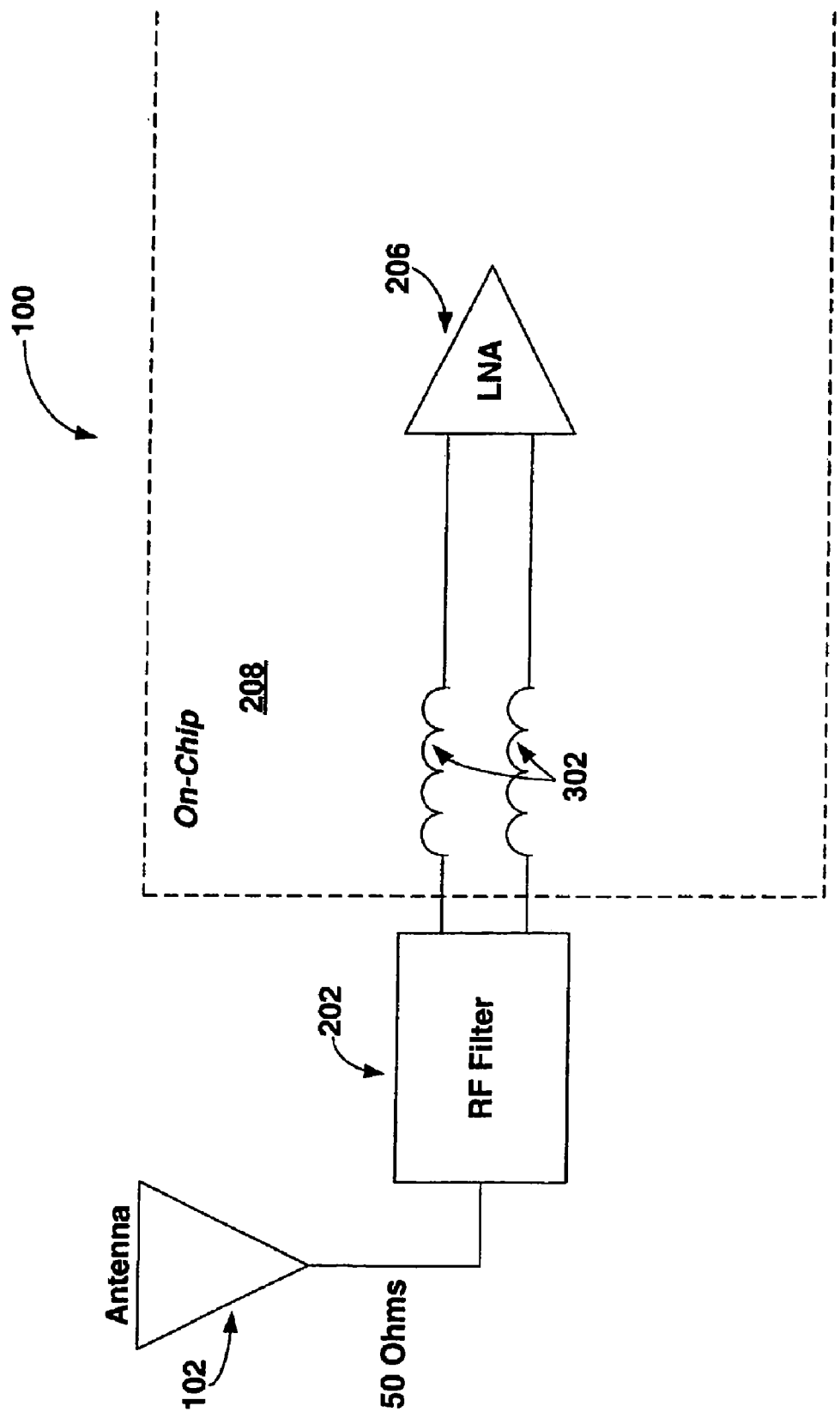
FIG. 3 is a block diagram showing an RF receiver circuit utilizing in-silicon matching via inductors.
Figure 4:
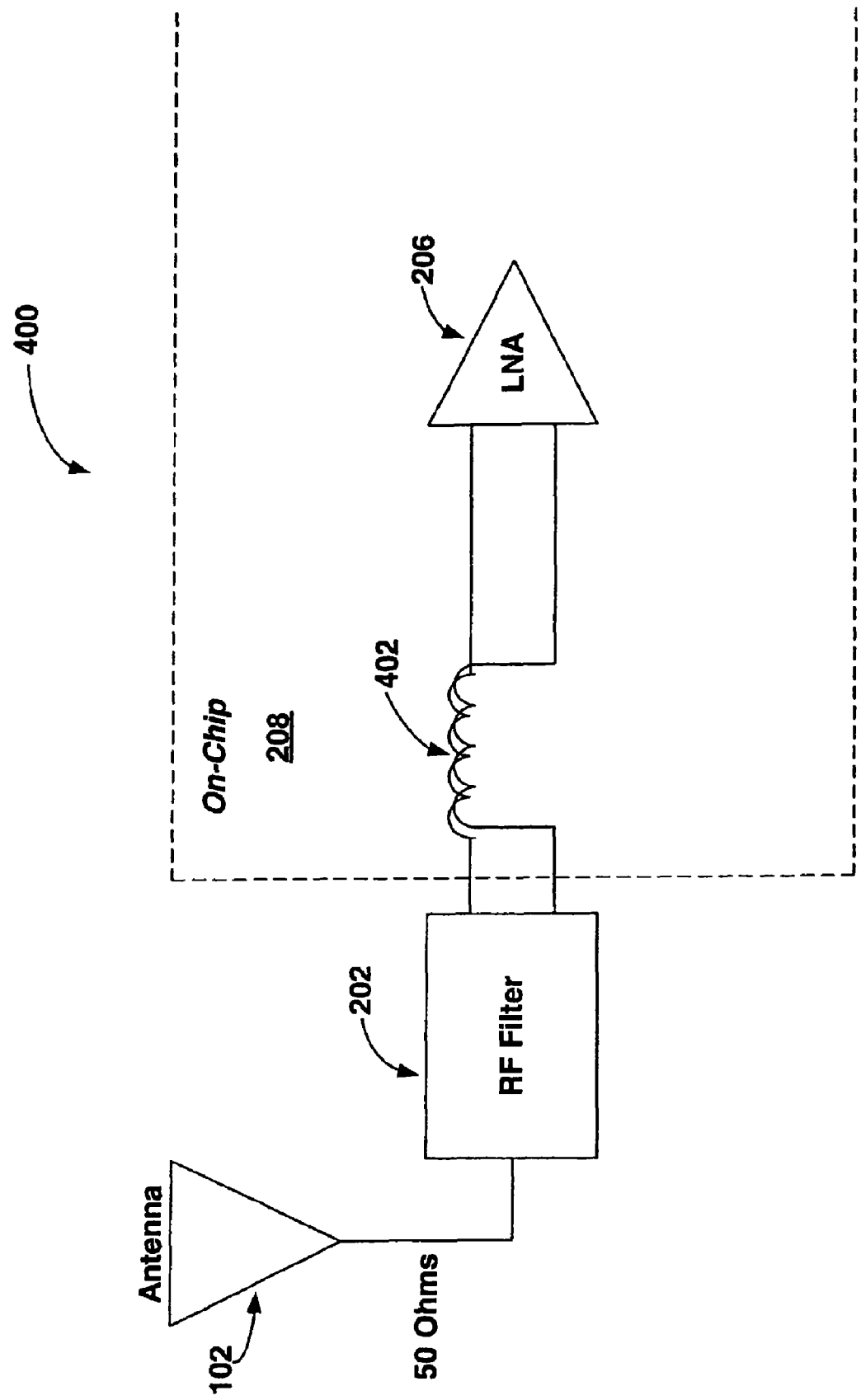
FIG. 4 is a block diagram showing an RF receiver circuit utilizing in-silicon matching via interleaved inductors, in accordance with an embodiment of the present invention.

FIG. 4 is a block diagram showing an RF receiver circuit 400 utilizing in-silicon matching via interleaved inductors, in accordance with an embodiment of the present invention. The RF receiver circuit 400 includes an antenna 102 coupled to an RF filter circuit 202. In addition, the RF circuit 400 includes an in-silicon interleaved inductor 402, which is incorporated on the chip 208 and coupled to the LNA 206. Although FIG. 4 illustrated an RF receiver circuit, it should be borne in mind that the interleaved inductor 402 of the embodiments of the present invention can be utilized in any circuit to provide impedance matching and transformation.

Embodiments of the present invention utilized an in-silicon interleaved differential inductor 402 to provide impedance matching between the antenna 102 and the LNA 206. As mentioned above, prior art discreet match components have a high component and board area cost. Since the in-silicon interleaved differential inductor 402 is placed on the chip 208, the in-silicon interleaved differential inductor 402 saves valuable board space. By way of example, in two similar component value circuits, where the first circuit has three separate on chip differential inductors and the second circuit includes interleaved inductors instead of the three separate on chip differential inductors. The interleaved inductors consumed 25% less space per each inductor pair. A certain amount of space is required to be kept clear around each inductor (whether interleaved or not) so therefore the decreased area of the interleaved inductors also reduces the amount of clear area required around the interleaved inductor. As a result the interleaved inductors provide an overall space savings is about 50% over the separate differential inductors. In sum, the interleaved structure of the in-silicon interleaved differential inductor 402 provides a higher differential inductance in a much smaller on chip area than required by conventional inductor based impedance matching circuits.

As mentioned above, the LNA 206 receives and operates on a differential signal from the RF filter 202. Differential signal paths are utilized in high integration chips to reduce the effect of noise on the received signal. For example, if noise enters the signal paths via the substrate, the nature of the differential circuit makes any noise injected in this manner common mode. As a result, the noise is cancelled out of the signal.

Figure 5A:
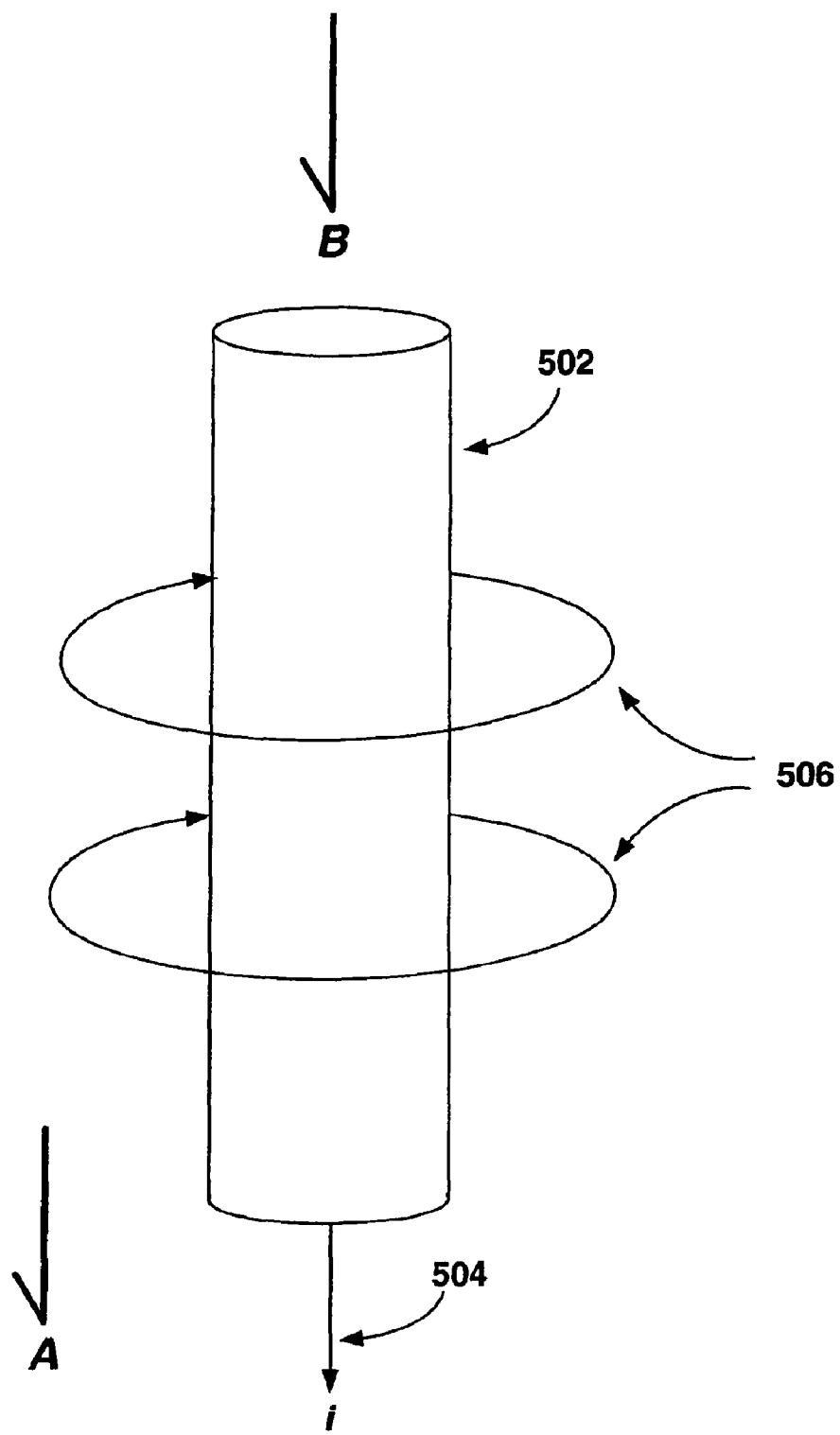
FIG. 5A is a diagram showing a relationship between magnetic fields and current, in accordance with an embodiment of the present invention.

Embodiments of the present invention take advantage of the electromagnetic properties of differential inductors to reduce the size of the match circuit footprint. FIG. 5A is a diagram showing a relationship between magnetic fields and current, in accordance with an embodiment of the present invention. As shown in FIG. 5A, passing a current 504 through a wire 502 generates magnetic field 506. In particular, when the current 504 flows through the wire in a direction "A" as shown in FIG. 5A, a magnetic field 506 is generated in a "clockwise" direction as viewed from "B."

Figure 5B:
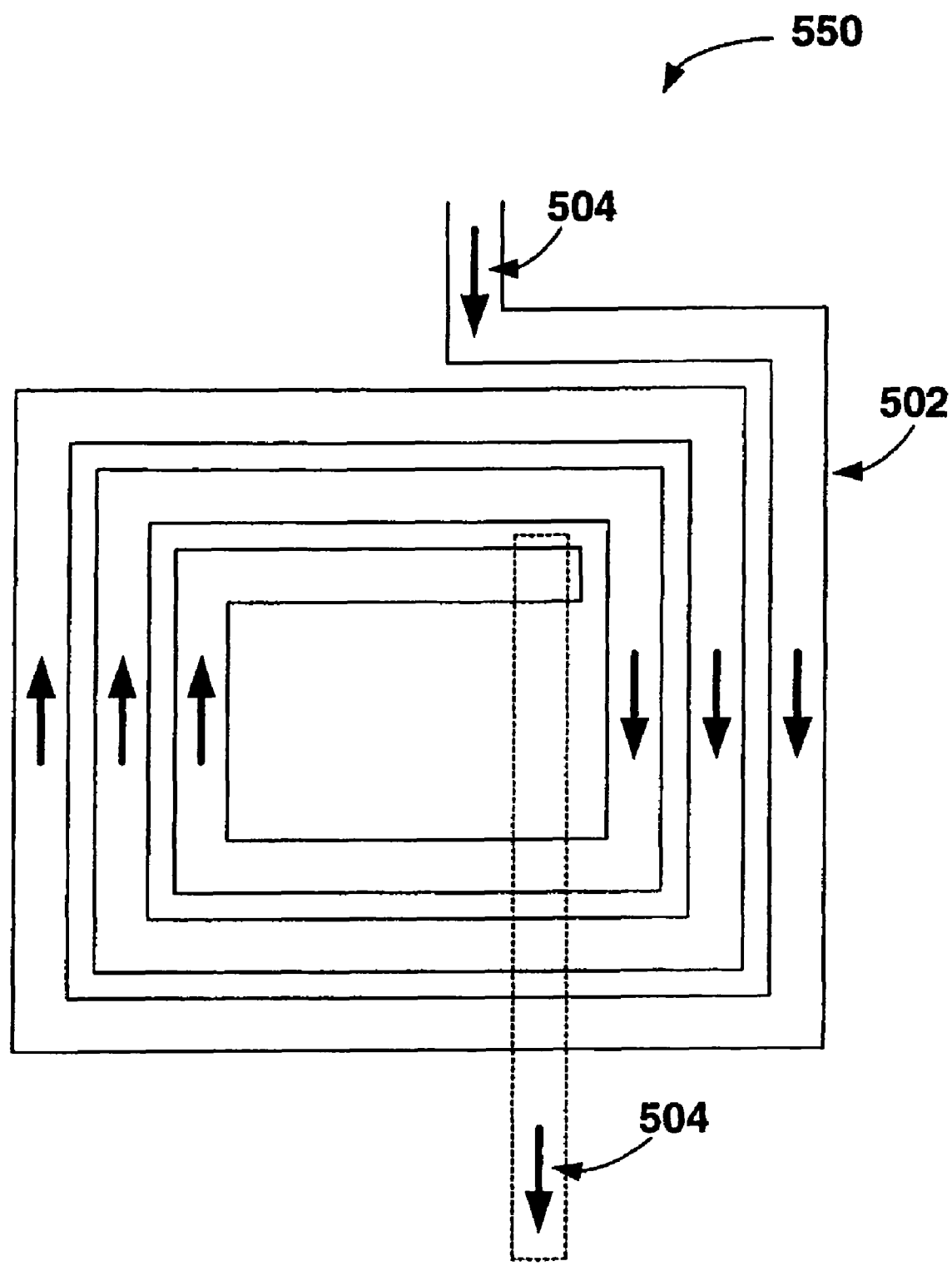
FIG. 5B is a diagram showing an in-silicon inductor, in accordance with an embodiment of the present invention.

FIG. 5B is a diagram showing an in-silicon inductor 550, in accordance with an embodiment of the present invention. Similar to above, the in-silicon inductor 550 generates a magnetic field when current 504 flows through the spiral wire 502 that comprises the in-silicon inductor 550. As indicated by the arrows in FIG. 5B, the inductor 550 is configured such that current flows in a single direction on each side of the inductor 550. As a result, the magnetic fields generated by each wire turn are added to each other on each side of the inductor 550. In this manner, the spiral wire 502 creates an inductor when current is applied to it.

Figure 6A:
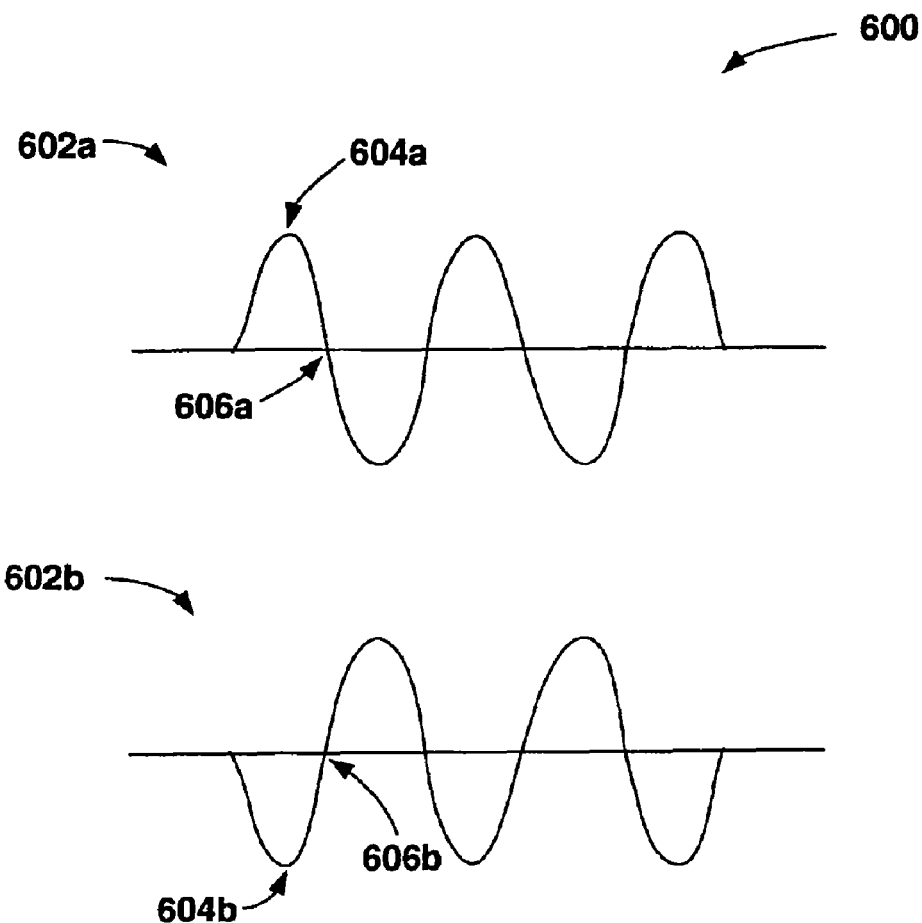
FIG. 6A illustrates components of an exemplary differential signal, in accordance with an embodiment of the present invention.

As mentioned above, embodiments of the present invention operate on a differential signal. FIG. 6A illustrates components of an exemplary differential signal 600, in accordance with an embodiment of the present invention. The differential signal 600 is illustrated using two graphs 602a and 602b, which illustrate two exemplary signal paths for the differential signal 600. As can be seen in FIG. 6A, the signal paths comprising the differential signal 600 are opposites of each other. For example, when the signal path 602a is high, as illustrated by point 604a, the corresponding point 604h of signal path 602b is low. However, when signal path 602a is zero, signal path 602b also is zero, as illustrated by points 606a and 606b.

Figure 6B:
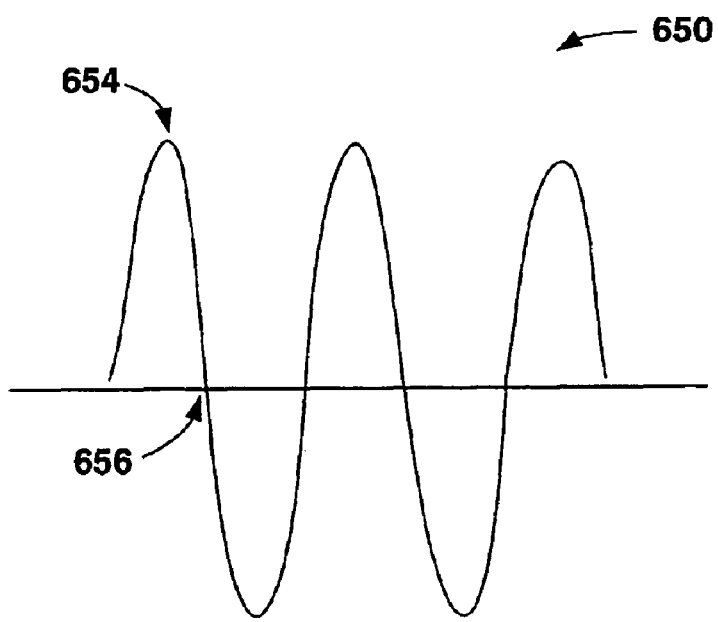
FIG. 6B is a graph showing the exemplary differential signal resulting from the component signals in FIG. 6A, in accordance with an embodiment of the present invention.

The difference of the individual signal paths 602a and 602b comprise the actual differential signal, as illustrated in FIG. 6B. FIG. 6B is a graph 650 showing the exemplary differential signal resulting from the component signals 600 in FIG. 6A, in accordance with an embodiment of the present invention. As can be seen, the differential signal 650 is actually twice as large as the component signals 600 in FIG. 6A. For example, if the amplitude of point 604a is x and the amplitude of point 604b is -x, the corresponding point 654 on the differential signal 650 will have an amplitude of 2x. In addition, as mentioned above, noise experienced on the differential components 600 is cancelled out in the actual differential signal 650. As can be appreciated, when x=0, 2x–O as illustrated by point 656 on FIG. 6B.

As illustrated in FIG. 6A, at any given time the signals are flowing in opposite directions of each other. The embodiments of the present invention utilize this property of the differential signal to generate increased inductance utilizing an interleaved inductor, as illustrated in FIG. 7.

Figure 7:
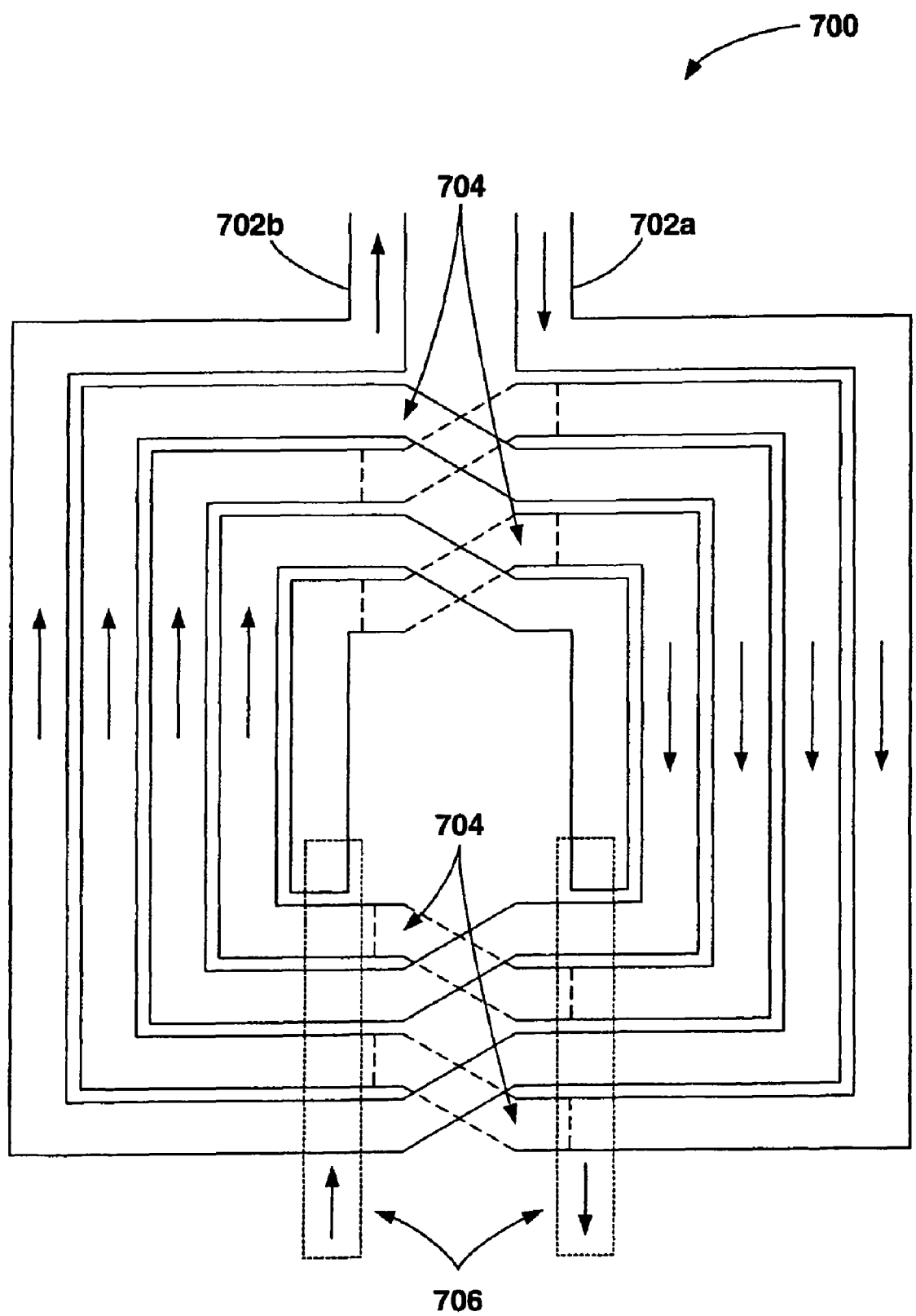
FIG. 7 is a diagram showing an in-silicon interleaved inductor, in accordance with an embodiment of the present invention.

FIG. 7 is a diagram showing an in-silicon interleaved inductor 700, in accordance with an embodiment of the present invention. The in-silicon interleaved inductor 700 comprises two inductors 702a and 702b interleaved with each other. The inductors 702a and 702b are configured such that a differential signal flowing through the inductors 702a and 702b generates additive magnetic fields.

In particular, to create the interleaved differential inductor 700, one of the two identical inductors 702a and 702b is flipped about the center axis. In addition, the turns of the flipped inductor are inserted between the turns of the other inductor. In this manner, all the differential currents in adjacent segments move in the same direction. As a result, a higher inductance is achieved in a much smaller space than that required by prior art impedance matching inductor pairs.

For example, in FIG. 7, the inductors 702a and 702b are interleaved using separate connecting sections 704. As will be appreciated by those skilled in the art, the connecting sections 704 allow one inductor to overlap the other inductor. In one embodiment the inductors 702a and 702b are created using three metal layers. For example, the main area on each inductor 702a and 702b can be created on the M6 metal layer. The connecting sections 704 can be created, for example, on the M5 metal layer, and the output sections 706 of the inductors 702a and 702b can be created on the M4 metal layer.

To reduce resistance, one embodiment utilizes two metal layers for connecting sections 704. When a metal path has a particular resistance R, placing a second metal path next to, and in parallel with, the first metal path will result in a lower overall resistance along that signal path. Hence, one embodiment of the present invention stacks two metal layers on top of each other to create the connecting sections 704. For example, each connecting section 704 can be created using the M4 and M5 metal layers. In this manner, total overall resistance can be reduced.

As will be appreciated by those skilled in the art, a differential current includes two signal paths traveling on opposite directions. For example, in FIG. 7, inductor 702a has a current flowing through it in a direction indicated by the arrows along the inductor 702a. Similarly, inductor 702b has a current flowing through it in a direction opposite that of inductor 702a, indicated by the arrows along the inductor 702b. By interleaving the two inductors 702a and 702b, the opposite currents flow in the same direction on each side of the in-silicon interleaved inductor 700 as illustrated by the arrows along the sides of the interleaved inductor 700.

As can be appreciated by those skilled in the art, the measure of inductor performance is called the quality factor or "Q." Q is defined as $Im(Z)/Re(Z)$, where $Im(Z)$ is the imaginary part of the impedance of an inductor and $Re(Z)$ is the real or resistive part of the impedance of an inductor. Generally, $Im(Z)$ represents the inductance minus the capacitance of the inductor structure, while $Re(Z)$ represents a value determined by the sum of the structure's resistive losses.

The value of Q varies with the frequency of the electrical signal being carried in the metal spiral of the interleaved inductor 700. A high performing inductor has a high Q when it has an impedance with a high imaginary part and a low real part. Because the inductance is higher in the interleaved differential inductor 700, the interleaved differential inductor 700 can have a high Q while being made smaller than conventional impedance matching inductor pairs. Thus, less metal is needed in each differential path through the interleaved differential inductor 700. Since loss is increased by the amount of metal traversed in a signal path, the inter-leaved differential inductor 700 reduces signal loss.

The present invention may be implemented using any type of integrated circuit logic, state machines, or software driven computer-implemented operations. By way of example, a hardware description language (HDL) based design and synthesis program may be used to design the silicon-level circuitry necessary to appropriately perform the data and control operations in accordance with one embodiment of the present invention.

The invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A device, comprising:
   a first component; and
   a second component coupled to the first component, the second component including:
   a first inductor integrated on a monolithic IC having a plurality of segments,
   a second inductor integrated on the monolithic IC having a plurality of segments,
   wherein segments in the plurality of first inductor segments are alternately disposed with segments in the plurality of second inductor segments such that a first inductor segment is adjacent to a second inductor segment,
   wherein currents in each of the first inductor segments and second inductor segments flow in the same direction, and
   wherein an input of the first inductor receives a first component of a differential input signal, an input of the second inductor receives a second component of the differential input signal, an output of the first inductor produces a first component of a differential output signal, and an output of the second inductor produces a second component of the differential output signal.

2. The device of claim 1, wherein a segment in the plurality of first inductor segments and a segment in the plurality of second inductor segments are disposed on different metal layers.

3. The device of claim 1, wherein the second component is included in a chip positioned on a surface of a substrate in a semiconductor package.

4. The device of claim 3, wherein the first component is included in a second chip positioned on the surface of the substrate in the semiconductor package.

5. The device of claim 3, wherein a center axis of the first inductor is substantially aligned with a center axis of the second inductor.

6. The device of claim 5, wherein the center axis of the first inductor and the center axis of the second inductor are perpendicular to the surface of the substrate.

7. The device of claim 5, wherein the center axis of the first inductor and the center axis of the second inductor are parallel to the surface of the substrate.

8. The device of claim 1, wherein the second component is included in a die positioned on a carrier, wherein the carrier is encased in a semiconductor package.

9. The device of claim 8, wherein the first component is included in a second die positioned on the carrier.

10. The device of claim 1, wherein the device is a radio frequency transceiver.

11. The device of claim 10, wherein the radio frequency transceiver is a wireless radio frequency transceiver.

12. The device of claim 10, wherein the radio frequency transceiver is a wired radio frequency transceiver.

13. The device of claim 1, wherein the device is a radio frequency receiver.

14. A device, comprising:
   a first component; and
   a second component coupled to the first component, the second component including:
   a first inductor integrated on a monolithic IC having first pattern,
   a second inductor integrated on the monolithic IC having a second pattern,
   wherein the second pattern is positioned relative to the first pattern such that a first current in the first inductor and a second current in the second inductor flow in the same direction, and
   wherein an input of the first inductor receives a first component of a differential input signal, an input of the second inductor receives a second component of the differential input signal, an output of the first inductor produces a first component of a differential output signal, and an output of the second inductor produces a second component of the differential output signal.

15. The device of claim 14, wherein the first pattern is substantially disposed on a first metal layer and the second pattern is substantially disposed on a second metal layer.

16. The device of claim 14, wherein the second component is included in a chip positioned on a surface of a substrate in a semiconductor package.

17. The device of claim 16, wherein the first component is included in a second chip positioned on the surface of the substrate in the semiconductor package.

18. The device of claim 16, wherein a center axis of the first inductor is substantially aligned with a center axis of the second inductor.

19. The device of claim 18, wherein the center axis of the first inductor and the center axis of the second inductor are parallel to the surface of the substrate.

20. The device of claim 19, wherein the center axis of the first inductor and the center axis of the second inductor are perpendicular to the surface of the substrate.

21. The device of claim 14, wherein the second component is positioned on a carrier, wherein the carrier is encased in a semiconductor package.

22. The device of claim 21, wherein the first component is included in a second die positioned on the carrier.

23. The device of claim 14, wherein the device is a radio frequency transceiver.

24. The device of claim 23, wherein the radio frequency transceiver is a wireless radio frequency transceiver.

25. The device of claim 23, wherein the radio frequency transceiver is a wired radio frequency transceiver.

26. The device of claim 14, wherein the device is a radio frequency receiver.

27. A device, comprising:
a first component; and
a second component coupled to the first component, the second component including:
  a first spiral inductor integrated on a monolithic integrated circuit (IC) having an outer portion, an inner portion, and an intermediate portion,
  a second spiral inductor integrated on the monolithic IC having an outer portion, an inner portion, and an intermediate portion,
wherein the first and second spiral inductors are interleaved such that the outer portion of the first spiral inductor is adjacent to the intermediate portion of the second spiral inductor, the outer portion of the second spiral inductor is adjacent to the intermediate portion of the first spiral inductor, the inner portion of the first spiral inductor is adjacent to the intermediate portion of the second spiral inductor, and the inner portion of the second spiral inductor is adjacent to the intermediate portion of the first spiral inductor,
wherein currents in each portion of the first and second spiral inductors flow in the same direction, and
wherein an input of the first inductor receives a first component of a differential input signal, an input of the second inductor receives a second component of the differential input signal, an output of the first inductor produces a first component of a differential output signal, and an output of the second inductor produces a second component of the differential output signal.

28. The device of claim 27, wherein a substantial part of the first spiral inductor and a substantial part of the second spiral inductor are disposed on a first metal layer.

29. The device of claim 27, wherein the second component is included in a chip positioned on a surface of a substrate in a semiconductor package.

30. The device of claim 29, wherein the first component is included in a second chip positioned on the surface of the substrate in the semiconductor package.

31. The device of claim 29, wherein a center axis of the first spiral inductor is substantially aligned with a center axis of the second spiral inductor.

32. The device of claim 31, wherein the center axis of the first spiral inductor and the center axis of the second spiral inductor are perpendicular to the surface of the substrate.

33. The device of claim 31, wherein the center axis of the first spiral inductor and the center axis of the second spiral inductor are parallel to the surface of the substrate.

34. The device of claim 27, wherein the second component is included in a die positioned on a carrier, wherein the carrier is encased in a semiconductor package.

35. The device of claim 34, wherein the first component is included in a second die positioned on the carrier.

36. The device of claim 27, wherein the device is a radio frequency receiver.

37. The device of claim 26, wherein the radio frequency receiver is a wireless radio frequency receiver.

38. The device of claim 27, wherein the device is a radio frequency transceiver.

39. The device of claim 27, wherein the second component is an impedance matching circuit.

* * * * *